United States Patent
Seo et al.

(10) Patent No.: US 6,358,666 B1
(45) Date of Patent: Mar. 19, 2002

(54) CHEMICALLY AMPLIFIED RESIST COMPOSITION CONTAINING NORBORNANE TYPE LOW MOLECULAR ADDITIVE

(75) Inventors: Dong Chul Seo; Sun Yi Park; Joo Hyeon Park; Seong Ju Kim, all of Taejon (KR)

(73) Assignee: Korea Kumho Petrochemical Co., Ltd. (KR)

( * ) Notice: Subject to any disclaimer, the term of this patent is extended or adjusted under 35 U.S.C. 154(b) by 0 days.

(21) Appl. No.: 09/616,859

(22) Filed: Jul. 14, 2000

(30) Foreign Application Priority Data

Dec. 20, 1999 (KR) .............................. 99-59334

(51) Int. Cl.⁷ ........................... G03F 7/004; C08F 10/00
(52) U.S. Cl. ................... 430/270.1; 430/914; 430/921; 526/281; 526/272
(58) Field of Search .............................. 430/270.1, 914, 430/921; 526/281, 272

(56) References Cited

U.S. PATENT DOCUMENTS

| | | | |
|---|---|---|---|
| 6,143,466 A | * 11/2000 | Choi | 430/270.1 |
| 6,146,810 A | * 11/2000 | Seo et al. | 430/270.1 |
| 6,150,069 A | * 11/2000 | Jung et al. | 430/270.1 |
| 6,235,448 B1 | * 5/2001 | Lee et al. | 430/270.1 |
| 6,265,130 B1 | * 7/2001 | Lee et al. | 430/270.1 |
| 6,268,106 B1 | * 7/2001 | Park et al. | 430/270.1 |

* cited by examiner

Primary Examiner—Janet Baxter
Assistant Examiner—Yvette M. Clarke
(74) Attorney, Agent, or Firm—Davidson, Davidson & Kappel, LLC

(57) ABSTRACT

This invention relates to a chemically amplified positive photoresist composition comprising a multi copolymer copolymer whose repeating units is represented by the following formula I, a low molecular additive represented by the following formula 2 or 3, an acid generator and a solvent

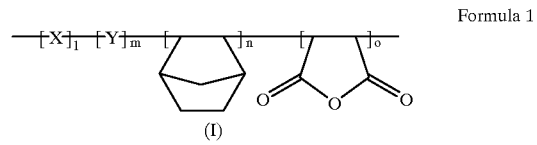
Formula 1 wherein the repeating units comprising X and Y are independent monomers, respectively, selected from the group consisting of the following formulae (II), (III) and (IV):

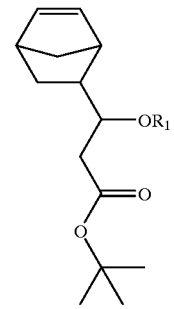

(II)

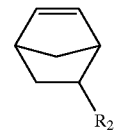

(III)

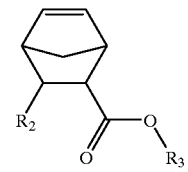

(IV)

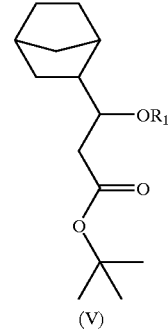

Formula 2
(V)

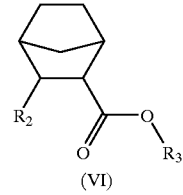

Formula 3
(VI)

4 Claims, No Drawings

CHEMICALLY AMPLIFIED RESIST COMPOSITION CONTAINING NORBORNANE TYPE LOW MOLECULAR ADDITIVE

FIELD OF THE INVENTION

This invention relates to a chemically amplified resist composition which can be effectively used for microprocessing a semiconductor element using various types of radiation such as KrF or ArF excimer laser as far ultraviolet rays, X-ray as synchrotron radiation and electron beam as charged particle radiation and more particularly, to the chemically amplified resist composition comprising A) a polymer containing acid-decomposable functional groups for the manufacture of a resist, B) an acid generator, and C) a low molecular additive which can serve to enhance the dry etch resistance and resolution of patterns.

DESCRIPTION OF THE RELATED ART

In general, a semiconductor element is prepared through a lithographic process, wherein a resist is implanted on a silicon wafer to form a film; the film is radiated by a light to form a pattern, followed by development to form a positive or negative pattern.

In parallel with the recent trend that the semiconductor technology is being developed in a higher integration, higher density, smaller size and higher speed due to LSI and VLSI, there has been great demand for the micro-processing of the semiconductor element having ultramicro-patterns of less than 0.2 micron. To meet such market need, a wavelength in the exposed regions has been far shorter from the conventional g-ray or i-line and thus, a new lithography technology using far ultraviolet rays, KrF or ArF excimer laser, X-ray and electron beam have drawn keen attention.

In the case of an ultraviolet ray such as i-line that has been mainly used in the conventional lithographic process, its micro-processing at the subquarter(0.25) micron level is reported to be extremely difficult. Therefore, to achieve the micro-processing at the subquarter micron level, an excimer laser with more short wavelength at the far ultraviolet rays can be utilized, together with X-ray and electron beam; among them, KrF or ArF excimer laser is being spotlighted from the related field.

A resist (hereinafter referred to as "chemically amplified resist") composition suitable for such excimer laser comprises a component having functional groups acid-decomposable (polymer), a component generating by irradiation (hereinafter referred to as "acid generator") and a solvent, which is being applied in the lithographic process using the chemically amplified effect induced by the acid generator.

In line with the chemically amplified resist composition, the Japanese Pat. Heisei 2-27,660 has disclosed a resist composition comprising a polymer with t-butyl ester group of carboxylic acid or t-butylcarbonyl group of phenol, together with an acid generator. This method using the composition is based upon the principle that since t-butyl ester group or t-butylcarbonyl group in a polymer is dissociated and calibrated into hydroxyl group due to the action of acid generated from irradiation, the exposed regions are easily dissolved by an alkaline developer.

However, in the case of the chemically amplified resist used for KrF excimer laser, a phenol resin has been mostly employed as a base material but it has proven to be insuitable for a matrix resin due to the fact that the aromatic ring in the resin absorbs much more light from ArF excimer laser. To comply with this matter, intensive research for polyacrylate derivatives as a matrix resin has been made, since it has relatively less absorption of light than phenol resin at ArF excimer laser region (Japanese Pat. Heisei 4-226,461 and Proc. SPIE, 1996, vol. 2724, p. 377).

Even though it has less absorption of light at ArF excimer laser region, polyacrylate has a poor dry etch resistance. Recently, to withcome such drawback of polyacrylate, much research has focused on the method of introducing alicyclic derivatives to polyacrylate in order to enhance the etch resistance but the affinity to a developer is decreased due to the fact that such alicyclic derivatives are hydrophobic. Further, to form the pattern of less than 0.2 micron, the adhesion between a resist composition and substrate is an important factor. In the case of the conventional polyacrylate matrix resin, carboxylic acid is introduced to the side chain of polyacrylate in an effort to improve the adhesion (Proc. SPIE, 1997, vol. 3049, p. 126). However, if the amount of carboxylic acid is increased to some extent, the increasing solubility to a basic solution makes it inevitable to change the basic concentration of a developer.

The matrix resin with hydrophilic groups, which can serve to improve a dry etch resistance, include a copolymer of maleic anhydride and olefin (Proc. SPIE, 1997, vol. 3049, p. 92). With its hydrophilic property, maleic anhydride can serve to facilitate the co-polymerization with an olefin-based monomer at a very low temperature and pressure. The olefin-based monomer can promote a dry etch resistance and resolution through the introduction of various substituents at the side chain of the copolymer (Proc. SPIE, 1998, vol. 3333, p. 463). Further, to overcome the shortcomings that the copolymer resin using maleic anhydride and olefin-based monomer has encountered (e.g., reduction of remaining film characteristics, decrease of dry etch resistance or occurrence of standing wave (정체파?) in forming the patterns), the recent method of using a low molecular additive for the manufacture of a resist has been greatly spotlighted (Korea Pat. No. 98-064842 and Proc. SPIE, 1998, vol. 3333, p. 73).

SUMMARY OF THE INVENTION

An object of this invention is to provide a chemically amplified resist composition, which is activated by far ultraviolet rays represented by KrF or ArF excimer laser as a chemically amplified resist, and with its excellent transparency on ArF excimer laser beam, the composition has excellent combination of properties such as resolution and sensitivity, including substrate adhesion, dry etch resistance and development properties.

To achieve the above object, the chemically amplified resist composition of this invention is characterized by the chemical composition containing a multi copolymer copolymer represented by the following formula 1, a low molecular additive represented by the following formulae 2 or 3, an acid generator and a solvent.

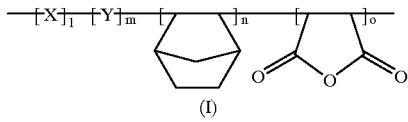

Formula 1 wherein the repeating units comprising X and Y are independent monomers, respectively, selected from the group consisting of the following formulae (II), (III) and (IV);

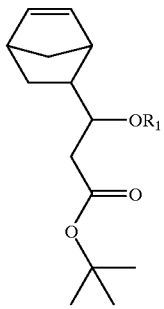

(II)

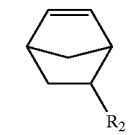

(III)

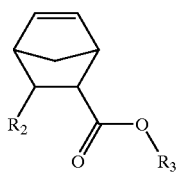

(IV)

wherein $R_1$ is a hydrogen atom, a linear or branched alkyl group, a cyclic or polycyclic alkyl group, an alkyl carbonyl group, a branched alkyl carbonyl group, a cyclic or polycyclic alkyl carbonyl group of 1 to 20 carbon atoms such as an acetyl group, a t-butyl oxycarbonyl group, a cyclohexane carbonyl group, an adamantane carbonyl group a bicyclo[2,2,1]heptane methyl carbonyl group.

$R_2$ is a hydrogen atom, a hydroxyl group, carboxylic group, an alkyl group, an alkyl group containing an alkoxy group, a hydroxyl group or a carboxylic acid, an alkoxy group, a linear alkyl oxycarbonyl group, a branched alkyl oxycarbonyl group, an alkoxy alkyl carbonyl group, a cyclic alkyl oxycarbonyl group or polycyclic alkyl oxycarbonyl group of 1 to 20 carbon atoms.

$R_3$ is a hydrogen atom, a linear or branched alkyl group, a cyclic or polycyclic alkyl group of 1 to 20 carbon atoms such as a methyl group, an ethyl group, a t-butyl group, an isopropyl group, an adamantyl group, a bicyclo[2,2,1] heptane methyl group.

l, m, n and o, which represent the repeating units of a polymer, are $0 \leq l/(l+m+n+o) \leq 0.5$, $0 \leq m/(l+m+n+o) \leq 0.5$, $0 \leq n/(l+m+n+o) \leq 0.35$ and $0.4 \leq o/(l+m+n+o) \leq 0.6$, respectively, with a value of $0.15 \leq (l+m)/(l+m+n+o) \leq 0.5$.

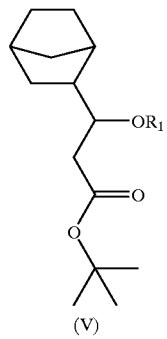

Formula 2

(V)

wherein $R_1$ is the same as defined above.

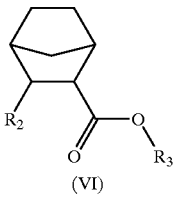

Formula 3

(VI)

wherein $R_2$, $R_3$ is the same as defined above.

DETAILED DESCRIPTION OF THE INVENTION

To further improve various shortcomings of the conventional chemically amplified positive resist in terms of a substrate adhesion, dry etch resistance and development, the inventor et al. have endeavored to improve the dry etch resistance with the introduction of a cyclic structure comprising maleic anhydride and norbornene derivatives to the main chain, while enhancing the adhesion with a substrate via introduction of hydroxyl group at the side chain of repeating units. In addition to that, further improvement of sensitivity and resolution during the manufacturing process of resist is ensured by introducing other different acid-decomposable functional groups. In particular, through a new introduction of a low molecular additive containing some functional groups which serve to inhibit the dissolution in the non-exposed regions but is acid-decomposable, the inventor et al have intended to improve the vertical at the side wall of pattern as well as resolution.

(A) Polymer

The polymer used for this invention comprises a repeating units consisting of maleic anhydride, norbornene or norbornene carboxylic acid derivatives, anhydrous norbornene carboxylic acid derivatives and norbornene derivatives whose side chains contain hydroxyl group or acid-decomposable functional group. Further, the polymer itself, so obtained from this invention, is insoluble or less soluble to alkaline solution with one or more of the protecting groups dissociated by an acid generator.

The alkali solubility of a polymer can be adjusted depending on the contents of acidic functional groups decomposed by an acid generator. As such, a variety of polymers can be prepared by selecting from norbornene derivatives and adjusting their contents in the main chain. The resist containing such polymer can have excellent combination of properties such as a dry etch resistance and substrate adhesion. On top of that, a resist composition with better sensitivity, resolution and thermal resistance can be obtained. The polymer used for this invention is a multi copolymer copolymer whose repeating units is represented by the formula 1.

Since each structure of the monomers, which are represented by the formulae (II), (III) and (IV), has hydroxyl group, carboxylic acid or one or more of acid-decomposable functional groups, including a linear or cyclic hydrophobic group, a resist containing such polymer of these monomers may serve to enhance the inhibitory effect of dissolution in the non-exposed regions, while enhancing the dry etch resistance.

The monomer, which is represented by the formula (II), is 3-bicyclo[2,2,1]hept-5-ene-2-yl-3-hydroxyl-propionic acid t-butyl ester (hereinafter referred to as "BHP") or other compounds derived from BHP. The detailed examples are as follows:

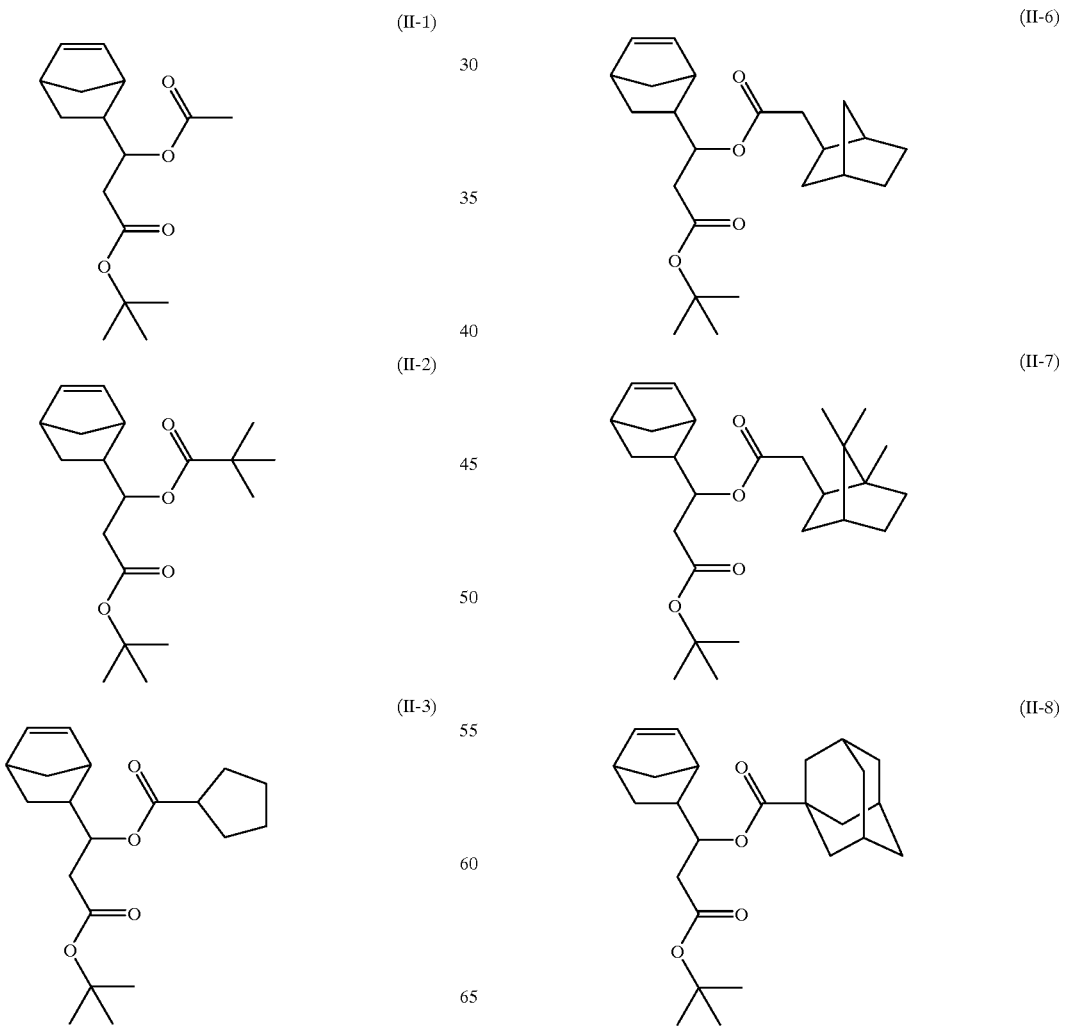

(II-9)

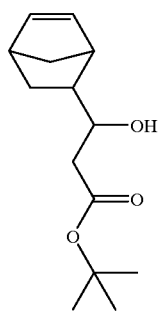

(III-5)

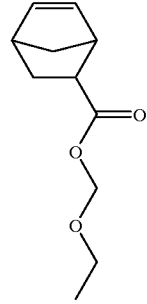

The monomer, which is represented by the formula (III), is norbornene carboxylic acid or other compounds derived from norbornene carboxylic acid. The detailed examples are as follows:

(III-1)

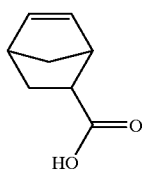

(III-6)

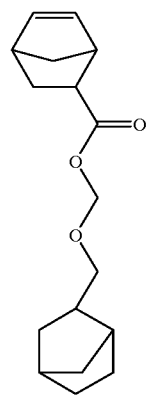

(III-2)

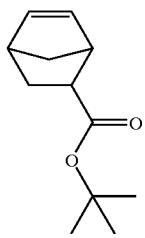

The monomer, which is represented by the formula (IV), is anhydrous norbornene carboxylic acid or other compounds derived from anhydrous norbornene carboxylic acid. The detailed examples are as follows:

(IV-1)

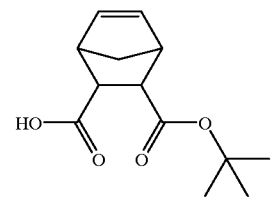

(III-3)

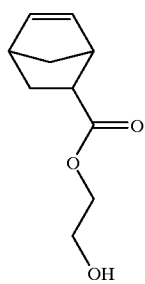

(IV-2)

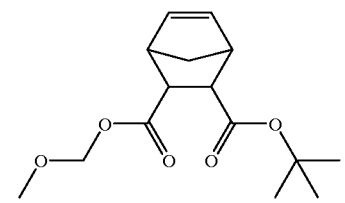

(III-4)

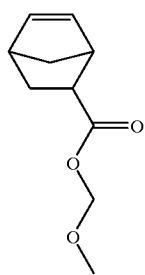

(IV-3)

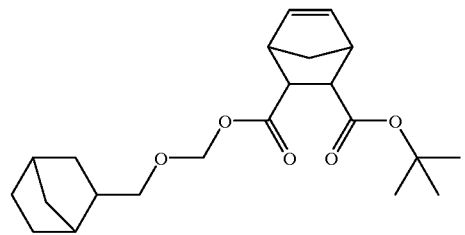

(IV-4)
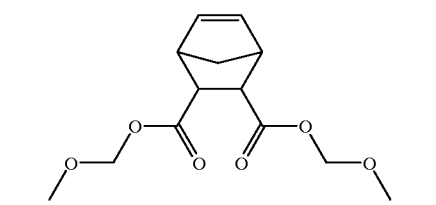

(IV-5)
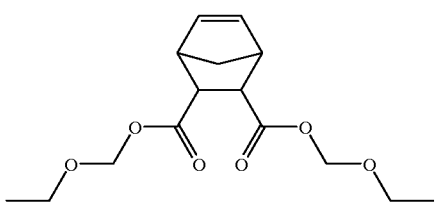

(IV-6)
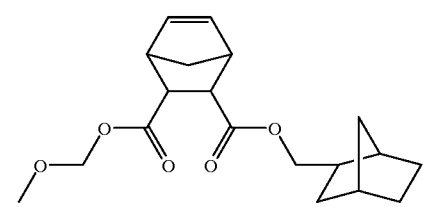

(IV-7)
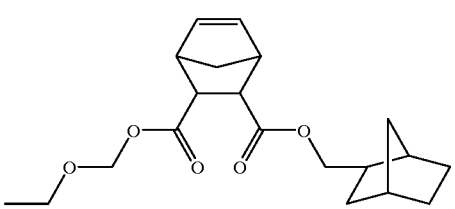

(IV-8)
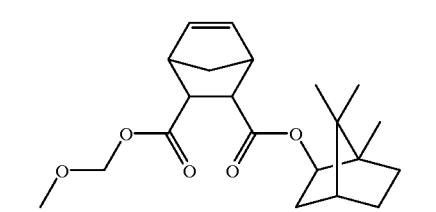

(IV-9)
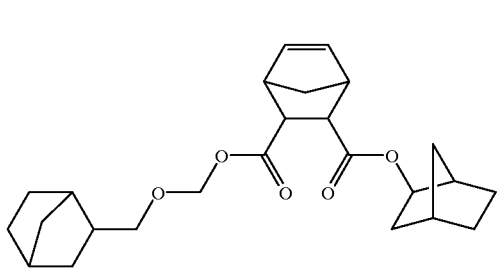

(IV-10)
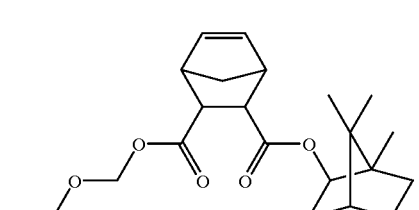

(IV-11)
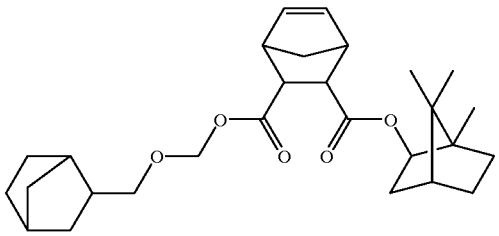

The polymer, which is represented by the formula 1, can be obtained via multi copolymer co-polymerization among norbornene, maleic anhydride and a monomer selected from norbornene derivatives represented by the formulae (II)~(IV). It is preferred that when the norbornene derivatives represented by X and Y are selected, X is selected from some norbornene derivatives containing hydroxyl group or carboxylic acid (e.g.: norbornene derivatives represented by the formulae (II-9), (III-3) and (IV-1), while Y is selected from norbornene derivatives which contain no hydroxyl group or carboxylic acid but with acid-decomposable functional groups.

The examples of multi copolymer copolymers, so polymerized by the above-mentioned method include the following polymers. The contents of repeating units contained in each resin can be appropriately adjusted in consideration of sensitivity, substrate adhesion and resolution.

(P-1)
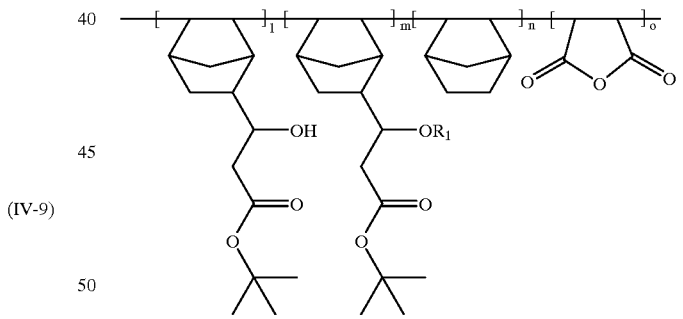

(P-2)
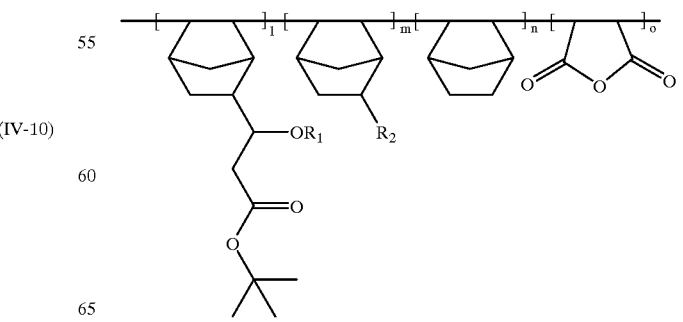

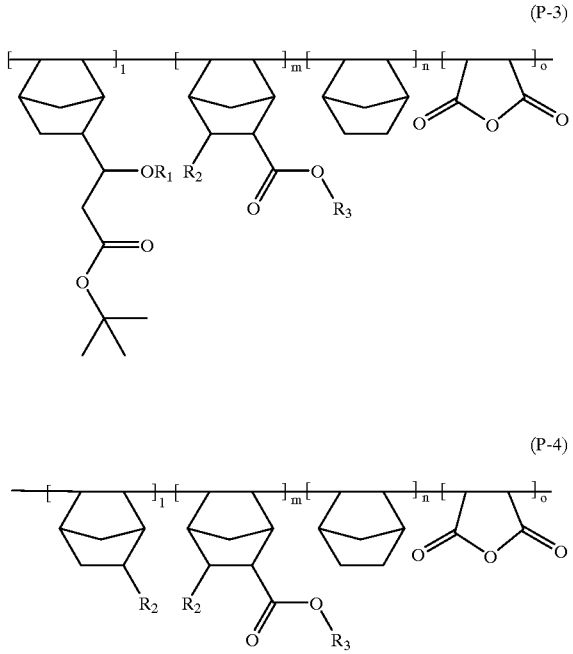

wherein $R_1$, $R_2$, $R_3$, l, m, n and o are the same as defined above.

The multi copolymer copolymer may be a block copolymer, a random copolymer or graft copolymer. According to this invention, the preferred multi copolymer copolymer is an alternative copolymer between maleic anhydride and norbornene derivatives or a random copolymer.

The polymerization process represented by the formula 1 may be conducted via a commonly available method but a solution polymerization is preferable using a radical polymerization initiator. The examples of the radical polymerization initiator include azo compounds selected from the group consisting of azobisisobutyronitrile (AIBN), dimethyl 2,2'-azobisisobutyrate, 1,1'-azobis(cyclohexane-1-carbonitrile), 2,2'-azobis(2-methylbutyronitrile), 2,2'-azobis(2,4-dimethylvaleronitrile), azobisisocapronitrile, azobisisovaleronitrile; or benzoyl peroxide (BPO); lauryl peroxide; and t-butylhydroperoxide. There is no special restriction for use if general types of radical polymerization initiators are employed.

The polymerization may be conducted via bulk polymerization, solution polymerization, suspension polymerization, bulk-suspension polymerization and emulsion polymerization; the examples of solvents during the solution polymerization include one or more of the solvents selected from the group consisting of benzene, toluene, xylene, benzene halide, diethyl ether, tetrahydrofuran, 1,4-dioxane, acetates, esters, lactones, ketones and amides.

The polymerization temperature of polymers represented by the formula 1 can be appropriately selected depending on the types of polymerization initiator. For example, when a polymerization initiator is azobisisobutyronitrile, its appropriate temperature is in the range of 60~80° C.

The molecular weight and molecular weight distribution of polymer may be appropriately adjusted depending on the amount of polymerization initiator and reaction time. After the polymerization is completed, it is preferred that the remaining monomer in a reaction mixture and by-products are removed by a solvent-precipitation method. The solvent used for precipitation may vary depending on the types of polymerization solvent and the structure of monomers used therein. In general, the examples of useful polymerization solvent include methanol, a co-solvent containing methanol and distilled water, ethanol, isopropyl alcohol, a co-solvent containing isopropyl alcohol and hexane, hexane and ether.

The polystyrene-calibrated weight average molecular weight (hereinafter referred to as "Mw") of the polymer, which is represented by the formula 1, is commonly in the range of 1,000~100,000 by gel permeating chromatography (GPC); the preferred Mw of polymer is in the range of 3,000~50,000 in terms of sensitivity, development, coating property and thermal resistance as a photoresist.

If the $M_w$ of polymer is less than 1,000, the coating and development properties will be significantly reduced due to poor formation of film, when the resist composition of this invention is applied to a substrate; in case of exceeding 100,000, various properties of the resist composition in terms of sensitivity, resolution and development will be reduced. The distribution of molecular weight of polymer is preferably in the range of 1.0~5.0, more preferably in the range of 1.0~3.0.

To measure the molecular weight and molecular weight distribution on polymers, so synthesized, GPC analysis instruments is used 1100 series device (HP Co.) and TriSEC detector (Viscotek Co.) under the following analytical conditions:

Column: G2500HXL (1 e.a.) & G4000HXL (1 e.a.)

Eluent: tetrahydrofuran

Flow rate: 1.0 ml/min.

Column temperature: 40° C. using a monodispersion polystyrene as standard. According to this invention, one or more of the polymer used for a resist may be used.

(B) Photoacid Generator

The acid generator used for the resist composition of this invention include iodonium salt, sulfonium salt, phosphonium salt, diazonium salt, pyridinium salt as an onium salt series; among them, the examples of the preferred salts include triphenylsulfonium triflate, diphenyl(4-methylphenyl)sulfonium triflate, diphenyl(4-t-butylphenyl)sulfonium triflate, diphenyl(4-methoxyphenyl)sulfonium triflate, diphenyl(naphtyl)sulfonium triflate, dialkyl(naphtyl)sulfonium triflate, triphenylsulfonium nonaflate, diphenyl(4-methylphenyl)sulfonium nonaflate, diphenyl(4-butylphenyl)sulfonium nonaflate, diphenyl(4-methoxyphenyl)sulfonium nonaflate, diphenyl(naphtyl)sulfonium nonaflate, dialkyl(naphtyl)sulfonium nonaflate, tridiphenylsulfonium hexafluoroantimonate, diphenyliodonium triflate, diphenyliodonium methylbenzene sulfonate, bis(cyclohexylsulfonyl) diazomethane and bis(2,4-dimethylphenylsulfonyl) diazomethane.

Unlike the conventional acid generator, the onium salt represented by the following formula 4 serves to inhibit the dissolution in the unexposed regions, while promoting the dissolution in the exposed regions. Formula 4

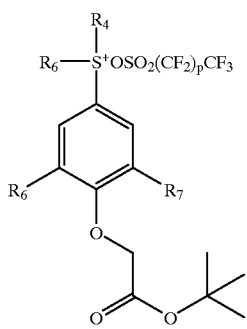
(PAG I)

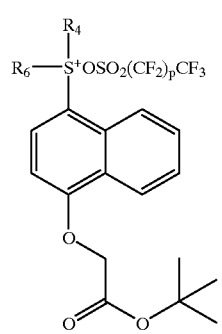
(PAG II)

wherein $R_4$ and $R_5$ are independently a linear or branched alkyl group, a cyclic or polycyclic alkyl group, or an aryl group;

$R_6$ and $R_7$ are independently a hydrogen atom, an alkyl group, or an alkoxy group;

p is an integer of 0~14.

The amount of the acid generator is contained in the range of 0.1~30 weight parts on the basis of 100 weight parts of the polymer, preferably in the range of 0.3~10 weight parts. According to this invention, one or more of the acid generators can be employed.

(C) Low Molecular Additive

The low molecular additive used for this invention can serve to improve a dry etch resistance through the introduction of cyclic structure within the molecules, while improving the vertical of the side walls of resist patterns with better contrast in development by enhancing the remaining film characteristics in the unexposed regions and by facilitating the dissolution on alkaline developer induced by acid in the exposed regions.

The compounds, which can serve to promote the dissolution rate of a developer through their decomposition by acid, include alicyclic derivatives that can be easily calibtated into deprotecting groups by acid.

The low molecular additives used for this invention is the compound represented by the formula 2 or 3, which belongs to norbornane-based compound where the double bond of norbornene-based monomer is reduced under hydrogenation.

The examples of the norbornane-based low molecular compound, which is represented by formula 2 or 3, include the following compounds.

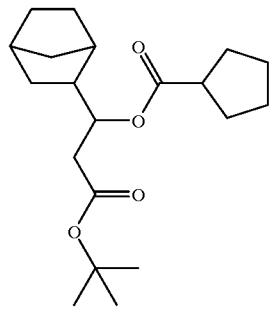
(V-1)

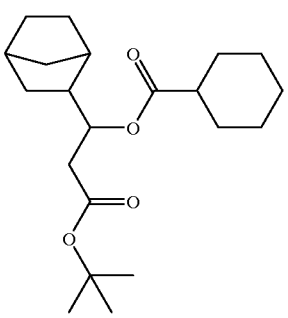
(V-2)

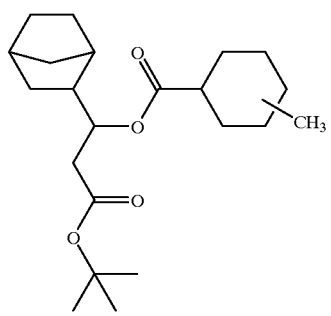
(V-3)

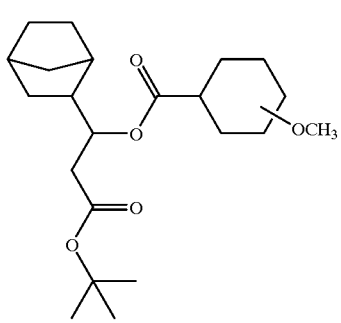
(V-4)

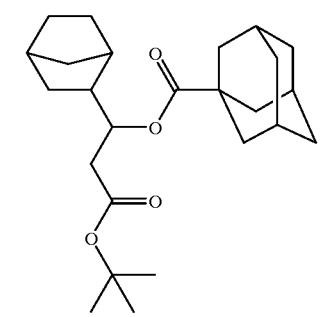
(V-5)

-continued (V-6) 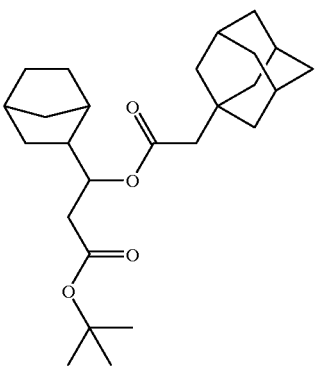

(V-7) 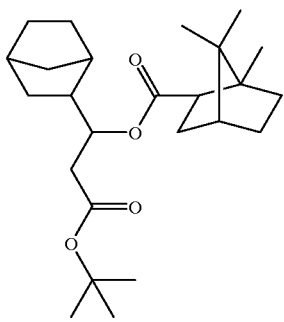

(V-8) 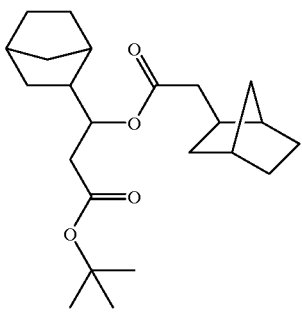

(VI-1) 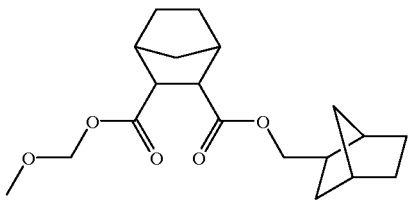

(VI-2)

(VI-3) 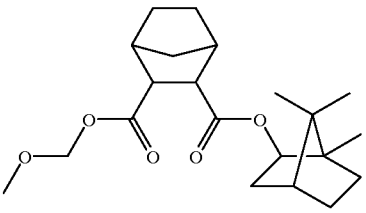

(VI-4) 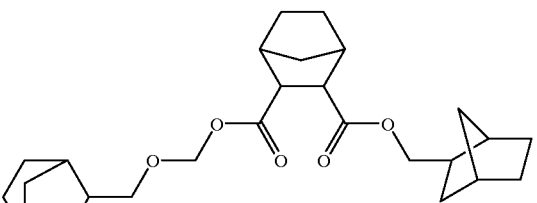

(VI-5) 

According to this invention, one or more of the low molecular compounds can be employed.

The amount of the low molecular compound used for the manufacture of resist is contained in the range of 3~50 weight parts on the basis of 100 weight parts of the polymer, preferably in the range of 5~40 weight parts. If the amount of the low molecular compound is less than 3 weight parts, any effect dose not appear but in case of exceeding 50 weight parts, the adhesion and coating property of resist on a substrate is significantly reduced.

The resist composition of this invention can use some additives, if desired; these additives include a surfactant, a halation inhibitor, an adhesive supplement agent, a storage stabilizer and a defoaming agent.

The examples of the surfactant include polyoxylauryl ether, polyoxystearyl ether, polyoxyethyleneoleyl ether, polyethylene glycol dilaurylate. It is preferred that the amount of the surfactant is containing less than 2 weight parts on the basis of 100 weight parts of the polymer.

Further, to prevent the diffusion of acid generated after exposure, some basic compounds can be employed. It is preferred that the amount of the basic compound is containing in the range of 0.01~5 weight parts on the basis of 100 weight parts of the polymer. If the amount of the basic compound exceeds 5 weight parts, the diffusion of acid is decreased but the sensitivity of resist becomes poor.

To achieve a homogeneous and flat film of the resist composition according to this invention, some solvents with appropriate evaporation rate and viscosity can be employed.

The examples of such solvent include ethyleneglycol monomethyl ether, ethyleneglycol monoethyl ether, ethyleneglycol monopropyl ether, methylselusolve acetate, ethylselusolve acetate, propyleneglycol monomethyl ether acetate, propyleneglycol monoethyl ether acetate, propyleneglycol monopropyl ether acetate, methyl ethyl ketone, cyclohexanone, methyl 2-hydroxylpropionate, ethyl 2-hydroxylpropionate, 2-heptanone, ethyl lactate and gamma-butyrolactone. According to this invention, one or more of the solvents can be employed, if desired.

The amount of solvent is adjusted in such a manner that it can be homogeneously distributed on a wafer through its appropriate use in consideration of volatility, viscosity, etc.

The resist composition of this invention is prepared in the form of solution and then, it is applied to a wafer, followed by a drying process to form a resist film. According to this invention, the coating method is performed in such a manner that the resist solution, so prepared and filtered, may be applied to a wafer substrate by the coating methods of spin, drift or roll.

The resist film coated by the above method, shall be partially radiated to form a micro-pattern. The examples of the radiation include ultraviolet i-line, far ultraviolet KrF excimer laser, ArF excimer laser, X-ray and electron beam as charged particle radiation. There is no special restriction on the types of radiation and the radiation may be selectively used depending on the types of acid generator. After irradiation, the resist film may be heated so as to improve sensitivity thereof.

According to this invention, the developer is selected from the group consisting of sodium hydroxide, potassium hydroxide, sodium carbonate, sodium silicate, sodium metasilicate, ammonia water, ethylamine, n-propylamine, triethylamine, tetramethyl ammonium hydroxide and tetra-etylammonium hydroxide; among them, it is preferred to select tetramethyl ammonium hydroxide. Surfactant or water-soluble alcohols may be used as an additive, if desired.

This invention is explained in more detail based on the following synthesis examples, polymerization examples and Examples but is not limited by these Examples.

Synthesis of Monomers and Low Molecular Compounds

Synthesis Example 1

A couple of Zn—Cu (50 g) and tetrahydrofuran (90 ml) were placed in a four-necked round flask equipped with a stirrer and reflux condenser and then, a mixing solution of t-butylbromoacetate (53 ml) and 5-norbornene-2-carboxaadehyde (36 ml) dissolved in tetrahydrofuran 180 ml was slowly added to the flask. The resulting solution was refluxed at 70° C. for 2 hours and cooled into room temperature. After separating a couple of Zn—Cu from the solution, the remaining solution was extracted, washed with a solvent and distilled under reduced pressure to obtain 3-bicyclo[2,2,1]hept-5-ene-2-yl-3-hydroxyl-propionic acid t-butyl ester (hereinafter referred to as "BHP", M-I) as a monomer (39 g).

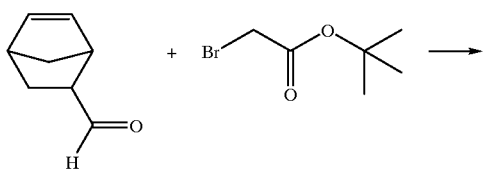

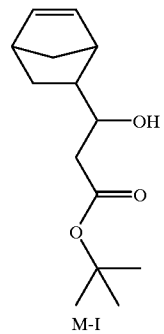

Synthesis Example 2

After acetyl chloride (20 g) was added to BHP (50 g) dissolved in methylene chloride and was cooled into 0° C., triethylamine (32 g) as a reaction catalyst was slowly added to the mixing solution. The reaction mixture was stirred at the same temperature for 1 hour and then, the solvent was removed by distillation under reduced pressure. The reaction mixture was diluted with ether and washed with distilled water, an aqueous solution of sodium carbonate and salt water. After the organic layer was separated, the remaining solution was dried with magnesium sulfate, followed by the complete removal of solvent to obtain a monomer (M-II, 57 g).

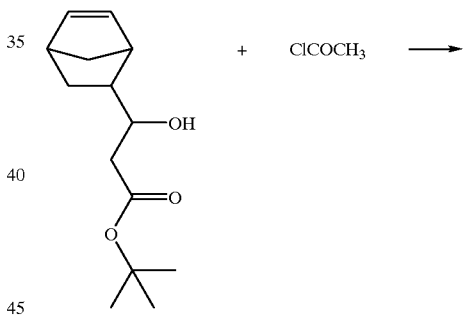

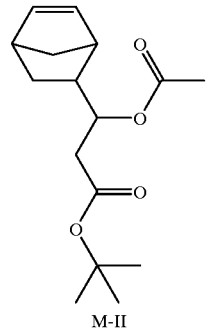

Synthesis Example 3

In the same manner as Synthesis example 2, a monomer (M-III, 66 g) was obtained except for the fact that cyclohexanecarbonyl chloride (37 g) was used instead of acetyl chloride (20 g).

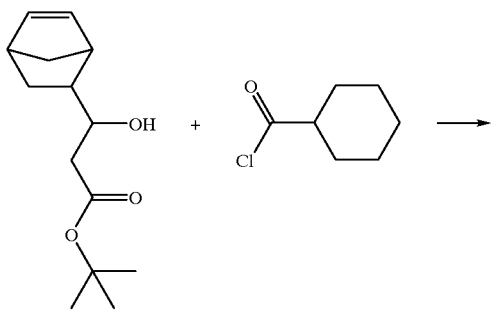

Synthesis Example 4

After chloromethyl methyl ether (21 g) was added to norbornene carboxylic acid (30 g) dissolved in methylene chloride and was cooled into temperature of 0° C., triethylamine (28 g) as a basic catalyst was slowly added to the mixing solution. The resulting solution was stirred at the same temperature for 1 hour and then, a solvent was removed by distillation under reduced pressure. The reaction mixture was diluted with ether and washed with distilled water, an aqueous solution of sodium carbonate and salt water. After the organic layer was separated, the remaining solution was dried with magnesium sulfate, followed by the complete removal of solvent to obtain a monomer (M-IV, 35 g).

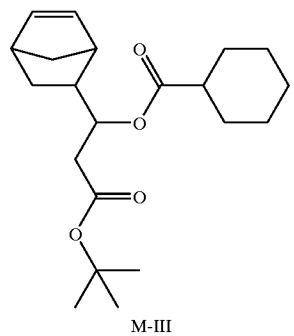

Synthesis Example 5

A mixture of 5-norbornene-2,3-dicarboxy anhydride (67 g) and diphenylaminopyridine (50 g) was dissolved in t-butanol (154 ml) and was stirred at 80° C. for 24 hours. The reaction mixture was precipitated in excess of 5% HCl solution, filtered and dried under vacuum to give bicyclo[2,2,1]-5-hepten-2,3-dicarboxylic acid mono-t-butyl ester (62 g).

In the same manner as Synthesis example 4, a monomer (M-V, 51 g) was obtained except for the fact that bicyclo[2,2,1]-5-hepten-2,3-dicarboxylic acid mono-t-butyl ester (52 g) was used instead of norbornene carboxylic acid (30 g).

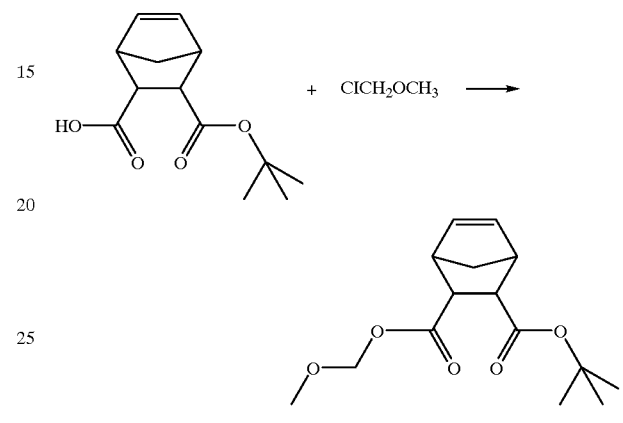

Synthesis Example 6

4-dimethylaminopyridine (44 g) was added to a mixture of anhydrous 5-norbornene-2,3-dicarboxylic acid (50 g) and isoborneol (47 g) dissolved in dimethylacetamide and stirred at 80° C. for 24 hours. The reaction mixture was precipitated in excess of 5% HCl solution, filtered and dried under vacuum to give the following compound (C-I, 65 g).

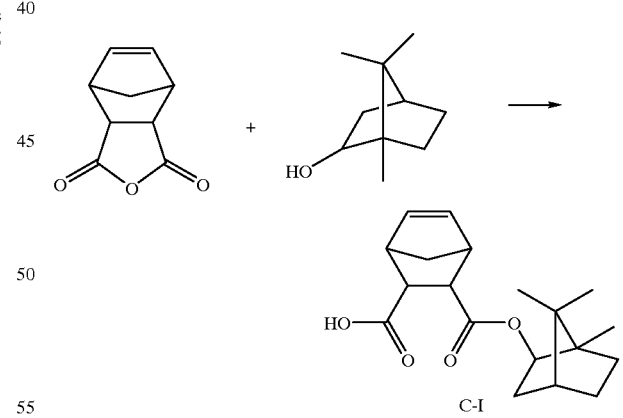

Chloromethyl methyl ether (7.7 g) was added to the compound (C-I, 25.5 g), so formed, dissolved in dimethylacetamide. The mixing solution was cooled into 0° C., stirred and with the slow addition of triethylamine (12.1 g) and then was stirred at the same temperature for 1 hour. The reaction mixture was diluted with ethyl ether and washed with a solution of $Na_2CO_3$ and distilled water. After the organic layer was separated, the remaining solution was dried with magnesium sulfate, followed by filtration to obtain a monomer (M-VI, 25.2 g).

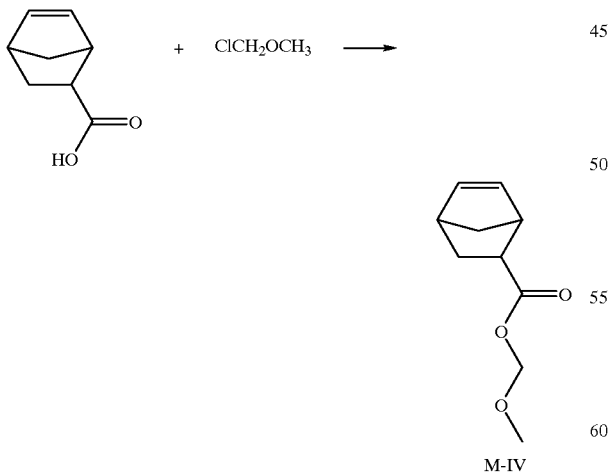

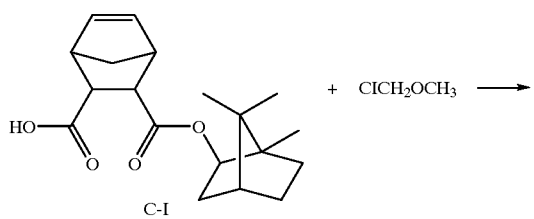

Synthesis Example 7

In the same manner as Synthesis example 6, the following compound (C-II, 64.4 g) was synthesized except for the fact that 2-norbornane methanol (37.9 g) was used instead of isoborneol (47 g). Except for the use of the compound (C-II, 23.2 g), so synthesized, the same procedure as described in Synthesis 6 was conducted to obtain a monomer (M-VII, 20.7 g).

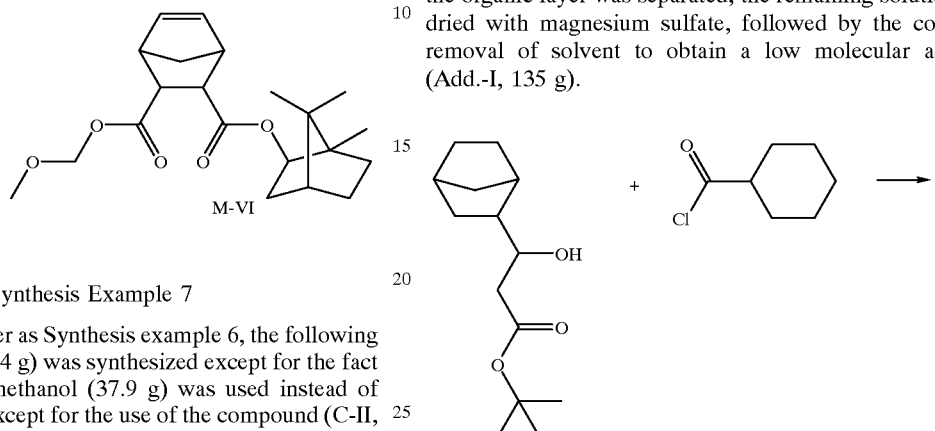

Synthesis Example 8

Cyclohexanecarbonyl chloride (73 g) was added to 3-bicyclo[2,2,1]hept-2-yl-3-hydroxylpropionic acid t-butyl ester (100 g), so formed through hydrogenation of BHP synthesized from Synthesis example 1, dissolved in methylene chloride and was cooled into 0° C. After triethylamine (64 g) as a reaction catalyst was slowly added to the mixing solution, the reaction mixture was stirred at the same temperature for 1 hour and then, the solvent was removed by distillation under reduced pressure. The reaction mixture was diluted with ether and washed with distilled water, an aqueous solution of sodium carbonate and salt water. After the organic layer was separated, the remaining solution was dried with magnesium sulfate, followed by the complete removal of solvent to obtain a low molecular additive (Add.-I, 135 g).

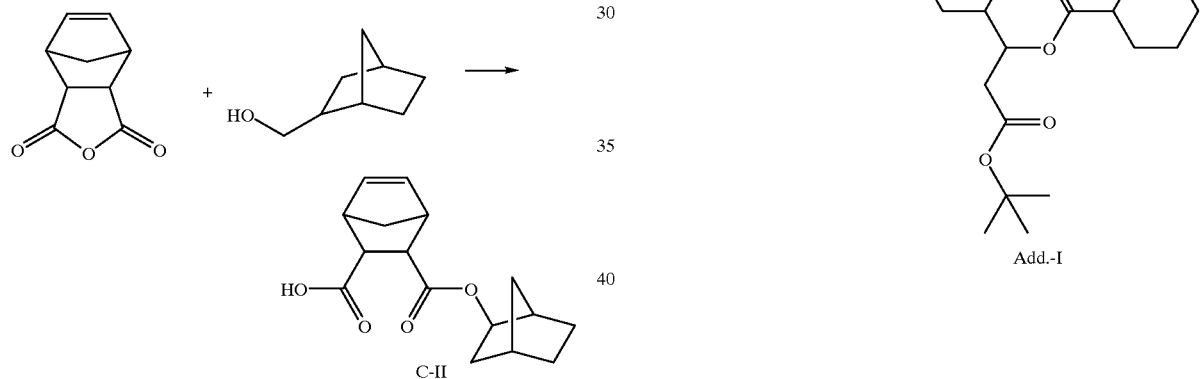

Synthesis Example 9

In the same manner as Synthesis example 8, a low molecular additive (Add.-II, 159 g) was obtained except for the fact that admantanecarbonyl chloride (99 g) was used instead of cyclohexanecarbonyl chloride (73 g).

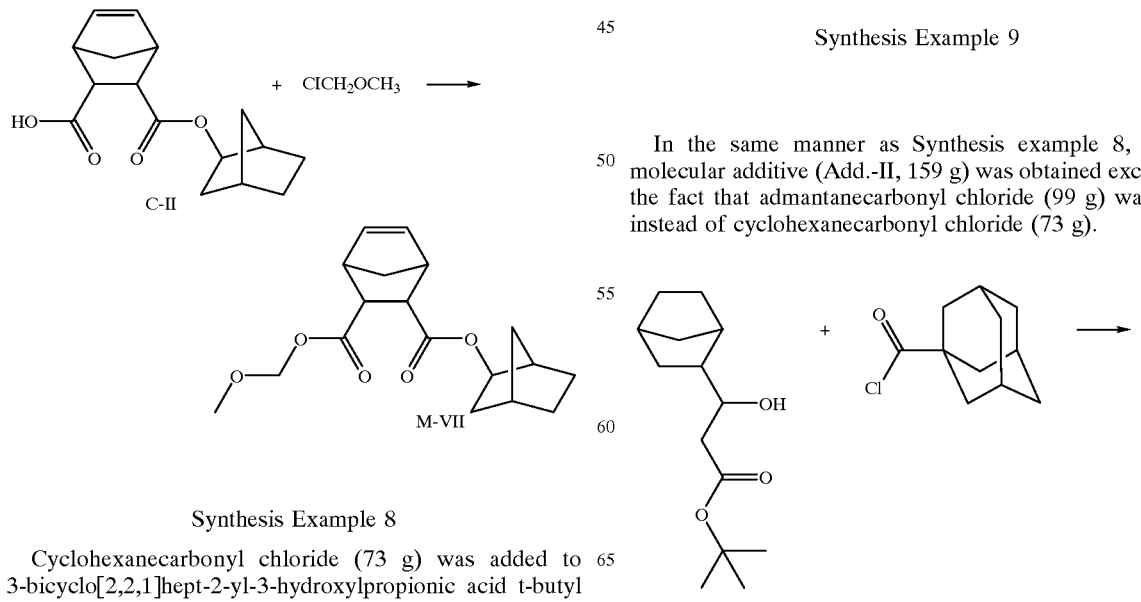

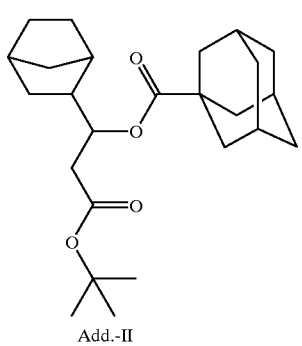

Add.-II

Synthesis Example 10

In the same manner as Synthesis example 8, a low molecular additive (Add.-III, 169 g) was obtained except for the fact that adamantane acetyl chloride (106 g) was used instead of cyclohexanecarbonyl chloride (73 g).

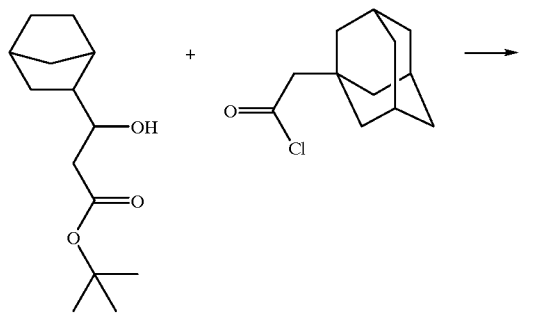

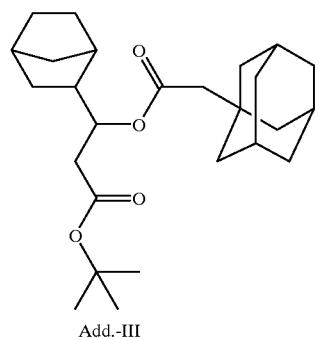

Add.-III

Synthesis Example 11

In the same manner as Synthesis example 8, low molecular additive (Add.-IV, 155 g) was obtained except for the fact that 2-norbornaneacetyl chloride (86 g) was used instead of cyclohexanecarbonyl chloride (73 g).

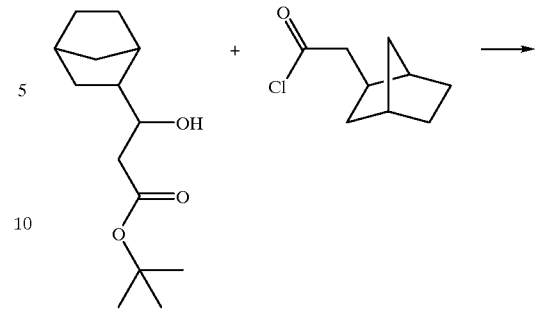

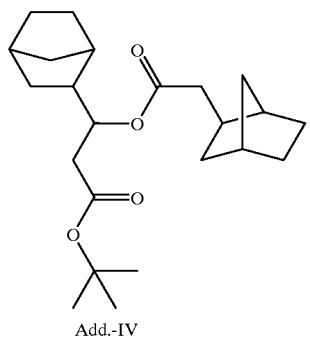

Add.-IV

Synthesis Example 12

In the same manner as Synthesis example 6, low molecular additive(Add.-V, 30.1 g) was obtained via hydrogenation of the intermediate compound, so formed, except for the fact that 2-(chloromethoxymethyl)bicyclo[2,2,1]heptane (12.7 g) was used instead of the (C-I) intermediate compound (25.5 g) and chloromethyl methyl ether (7.7 g).

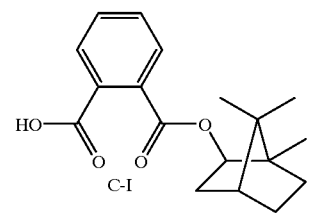

C-I

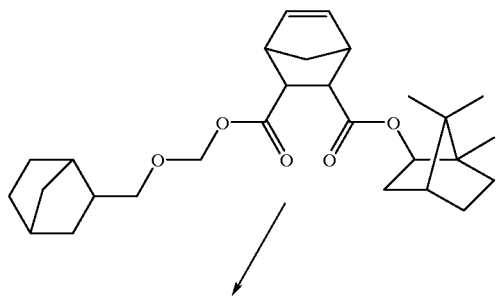

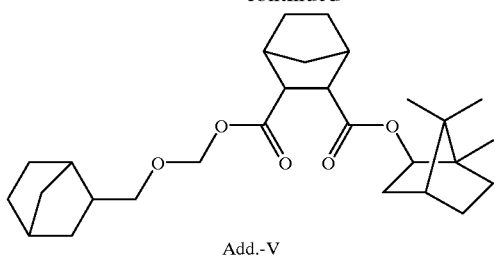

Add.-V

Synthesis Example 13

In the same manner as Synthesis example 7, a low molecular additive (Add.-V, 30.1 g) was obtained via hydrogenation of the intermediate compound, so formed, except for the fact that 2-(chloromethoxymethyl)bicyclo[2,2,1]heptane (12.7 g) was used instead of the (C-II) intermediate compound (26.8 g) and chloromethyl methyl ether (7.7 g).

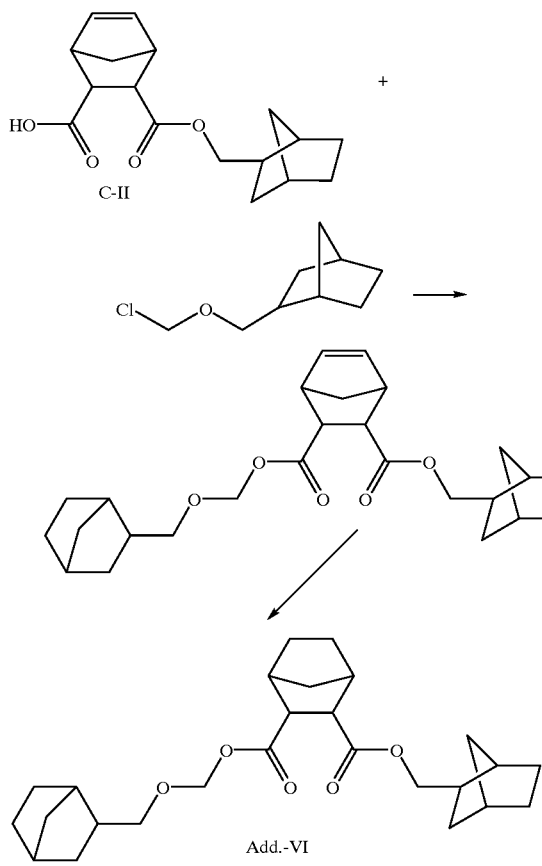

Add.-VI

Synthesis of Polymer

Polymerization Example 1

To a two-neck round flask equipped with a stirrer and a reflux condenser were added a M-I monomer (Synthesis example 1)/a M-II monomer (Synthesis example 2)/maleic anhydride/norbornene in the amount of 2.38 g/5.61 g/4.90 g/1.88 g, respectively. With the addition of AIBN (0.82 g) as a polymerization initiator and dioxane (29.55 g) as a polymerization solvent, the reacting mixture was stirred at room temperature for 2 hours, while argon gas was infused. With the temperature of a reactor maintained at 70° C., the reaction was conducted for 20 hours. The polymerization-completed solution was cooled to room temperature. The polymerization solution was diluted with dioxane, precipitated in a co-solvent containing excess of isopropyl alcohol/methanol [5/1] and filtered off. The solution was washed several times with a precipitation solvent in the same ratio as above and dried under reduced pressure to obtain 8.90 g of the following polymer (P1). The polystyrene-calibrated weight average molecular weight of the polymer was 8,500.

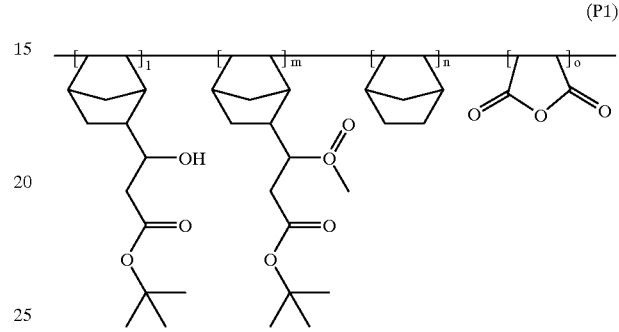

(P1)

Polymerization Example 2

To the flask were added a M-I monomer (Synthesis example 1)/ a M-III monomer (Synthesis example 3)/maleic anhydride/norbornene in the amount of 3.57 g/5.23 g/4.90 g/1.88 g, respectively, together with AIBN (0.82 g) as a polymerization initiator and dioxane (31.18 g) as a polymerization solvent. In the same manner as Polymerization example 1, 8.57 g of the following polymer (P2) was obtained. The polystyrene-calibrated weight average molecular weight of the polymer was 8,000.

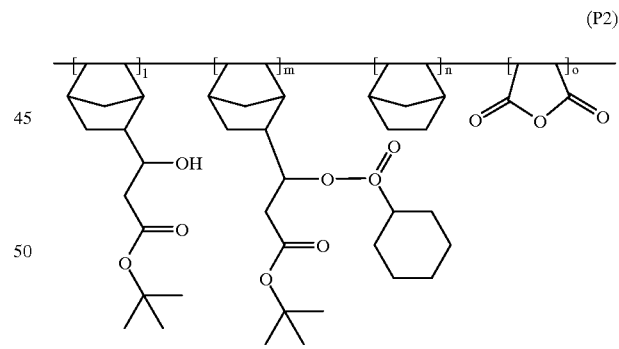

(P2)

Polymerization Example 3

To the flask were added a M-I monomer (Synthesis example 1)/ a M-IV monomer (Synthesis example 4)/maleic anhydride/norbornene in the amount of 4.77 g/1.82 g/4.90 g/1.88 g, respectively, together with AIBN (0.82 g) as a polymerization initiator and dioxane (26.75 g) as a polymerization solvent. In the same manner as Polymerization example 1, 6.70 g of the following polymer (P3) was obtained. The polystyrene-calibrated weight average molecular weight of the polymer was 6,500.

(P3)

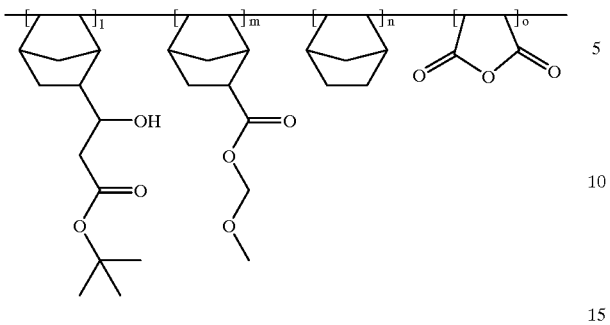

Polymerization Example 4

To the flask were added a M-I monomer (Synthesis example 1)/ a M-VI monomer (Synthesis example 5)/maleic anhydride/norbornene in the amount of 2.38 g/5.65 g/4.90 g/1.88 g, respectively, together with AIBN (0.82 g) as a polymerization initiator and dioxane (29.63 g) as a polymerization solvent. In the same manner as Polymerization example 1, 7.45 g of the following polymer (P4) was obtained. The polystyrene-calibrated weight average molecular weight of the polymer was 7,600.

(P4)

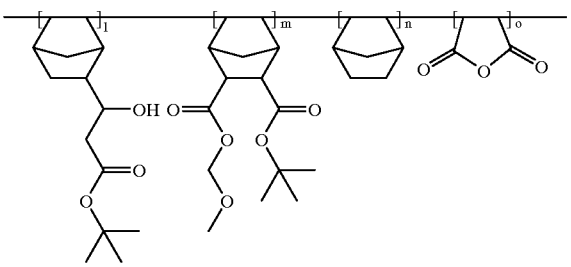

Polymerization Example 5

To a two-neck round flask equipped with a stirrer and a reflux condenser were added a M-I monomer (Synthesis example 1)/a M-VII monomer (Synthesis example 6)/maleic anhydride/norbornene in the amount of 4.77 g/5.44 g/4.90 g/1.41 g, respectively. With the addition of AIBN (0.49 g) as a polymerization initiator and ethylacetate (33.04 g) as a polymerization solvent, the reacting mixture was stirred at room temperature for 2 hours, while argon gas was infused. With the temperature of a reactor maintained at 65° C., the reaction was conducted for 20 hours. The polymerization-completed solution was cooled into room temperature. The polymerization solution was diluted with tetrahydrofuran, precipitated in an isopropyl alcohol solvent and filtered off. The solution was washed several times with a precipitation solvent in the same ratio as above and dried under reduced pressure to obtain 11.06 g of the following polymer (P5).

The polystyrene-calibrated weight average molecular weight of the polymer was 6,800.

(P5)

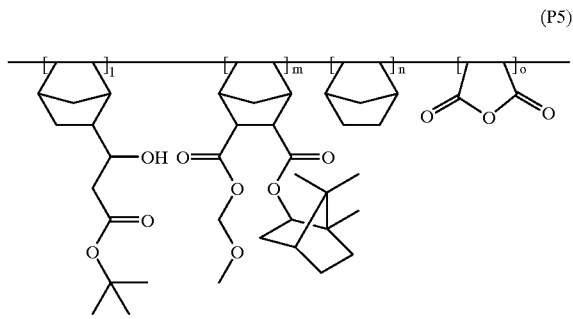

Polymerization Example 6

To the flask were added a M-I monomer (Synthesis example 1)/ a M-IX monomer (Synthesis example 7)/maleic anhydride/norbornene in the amount of 4.77 g/5.02 g/4.90 g/1.414 g, respectively, together with AIBN (0.49 g) as a polymerization initiator and ethylacetate (32.20 g) as a polymerization solvent. In the same manner as Polymerization example 5, 10.95 g of the following polymer (P6) was obtained. The polystyrene-calibrated weight average molecular weight of the polymer was 7,400.

(P6)

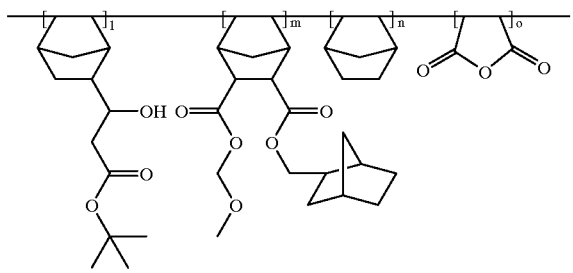

Polymerization Example 7

To the flask were added a M-I monomer (Synthesis example 1)/maleic anhydride/norbornene in the amount of 7.15 g/4.90 g/1.88 g, respectively, together with AIBN (0.82 g) as a polymerization initiator and ethylacetate (27.87 g) as a polymerization solvent. In the same manner as Polymerization example 5, 9.05 g of the following polymer (P7) was obtained. The polystyrene-calibrated weight average molecular weight of the polymer was 7,800.

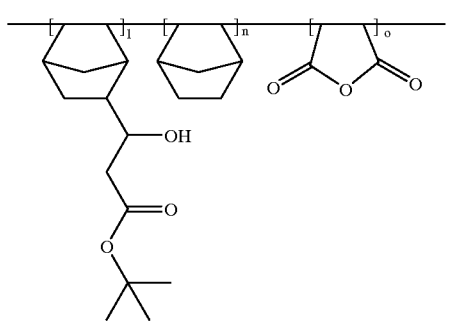

(P7)

Polymerization Example 8

To the flask were added a M-I monomer (Synthesis example 1)/ a M-VI monomer (Synthesis example 5)/maleic anhydride in the amount of 5.96 g /7.06 g/4.90 g, respectively, together with AIBN (0.49 g) as a polymerization initiator and ethylacetate (35.84 g) as a polymerization solvent. In the same manner as Polymerization example 5, 10.80 g of the following polymer (P8) was obtained. The polystyrene-calibrated weight average molecular weight of the polymer was 7,300.

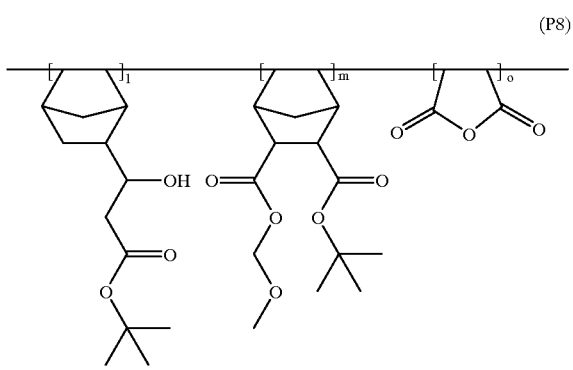

(P8)

Preparation a Resist and Evaluation

Example 1

A resist was prepared in such a manner that 100 weight parts of the resin (P1), so obtained from Polymerization example 1, 1.2 weight parts of triphenylsulfonium nonaflate as an acid generator, 0.2 weight parts of tetramethylammonium hydroxide as a basic additive and 15 weight parts of a low molecular additive (Add.-I), so formed form Synthesis Example 8, were dissolved in 550 weight parts of propylene glycol methyl ether acetate and filtered by a 0.2 μm membrane filter.

A substrate was coated with the resist solution, so obtained, using a spinner and dried at 110° C. for 90 seconds to form a 0.4 μm film in thickness. The film was exposed by an ArF excimer laser stepper and heated at 130° C. for 90 seconds. Then, the film was developed with 2.38 wt % of tetramethylammonium hydroxide solution for 60 seconds, washed and dried to form a resist pattern.

The development of the film with the tetramethylammonium hydroxide solution, including the adhesion of the resist pattern formed on a substrate, was proven to be good with a resolution of 0.14 μm and sensitivity of 22 mJ/cm$^2$.

As for the adhesion of the resist pattern from Example 1, the adhesion state on 0.18=μm line & space (L/S) pattern, so formed after development, was observed by a scanning electron microscope; when peeling off or detachment of pattern was not observed, it marked as "good' and vice versa, as "poor". Exposure amount was determined as an optimum exposure amount wherein exposure amount makes 0.18=μm line & space (L/S) pattern the line width of 1:1. And then optimum exposure amount was considered as the sensitivity and the minimum pattern measurement was regarded as a resolution.

Examples 2–8

Acid generators, basic additives and low molecular additive (Add.-II) were dissolved in 550 weight parts of propylene glycol methyl ether acetate and were added to each of the resins (P2~P8) obtained from Polymerization examples 2–8, filtered by 0.2 μm membrane filter to produce the resist composition as shown in the following table 1.

With the only exception of using ArF excimer laser light exposure device (lens numerical aperture: 0.60), each of the above compositions, so produced in these Examples, then proceeded in accordance with the Example 1 to form a positive resist pattern and were placed under a variety of assays and the results are shown in the following table 1.

Comparative Examples 1~3

Acid generators and basic additives were dissolved in 550 weight parts of propylene glycol methyl ether acetate and were added to the resins (P1~P3) obtained from Polymerization examples 1–3, filtered by 0.2 μm membrane filter to produce the resist composition as shown in the following table 1.

With the only exception of using ArF excimer laser light exposure device (lens numerical aperture: 0.60), each of the above compositions, so produced in these Examples, then proceeded in accordance with the Example 1 to form a positive resist pattern and were placed under a variety of assays and the results are shown in the following table 1. Table 1.

|  | Resin (wt. part) | PAG (wt. part) | Base (wt. part) | Add.-II (wt. part) | Standing wave(?) | Sensitivity (mJ/cm$^2$) | Resolution (μm) |
|---|---|---|---|---|---|---|---|
| Example 2 | P2 (100) | 1.4 | 0.2 | 15 | None | 22 | 0.13 |
| Example 3 | P3 (100) | 1.6 | 0.3 | 25 | None | 24 | 0.14 |
| Example 4 | P4 (100) | 1.6 | 0.3 | 20 | None | 18 | 0.12 |

-continued

|  | Resin (wt. part) | PAG (wt. part) | Base (wt. part) | Add.-II (wt. part) | Standing wave(?) | Sensitivity (mJ/cm$^2$) | Resolution ($\mu$m) |
|---|---|---|---|---|---|---|---|
| Example 5 | P5 (100) | 1.6 | 0.3 | 10 | None | 19 | 0.13 |
| Example 6 | P6 (100) | 1.6 | 0.3 | 10 | None | 20 | 0.13 |
| Example 7 | P7 (100) | 1.4 | 0.2 | 25 | None | 14 | 0.14 |
| Example 8 | P8 (100) | 1.4 | 0.2 | 15 | None | 16 | 0.13 |
| Comp. Example 1 | P1 (100) | 1.2 | 0.2 | 0 | Severe | 25 | 0.14 |
| Comp. Example 2 | P2 (100) | 1.2 | 0.2 | 0 | Severe | 26 | 0.15 |
| Comp. Example 3 | P3 (100) | 1.0 | 0.1 | 0 | Slight | 28 | 0.16 |

Acid generator (PAG): Triphenylsulfonium nonaflate
Basic additive (base): Tetramethylammonium hydroxide
Low molecular additive (Add.-II): Synthesis example 9

The above table 1 shows that adhesion and the development of the resist patterns obtained from the above Examples and Comparative Examples were fairly good. Moreover, the result that the resist patterns did not change at all when the above resist compositions were placed on a hot plate of 130° C. proves that they have excellent heat-resistance. In particular, the resist compositions with low molecular additive did not exhibit standing wave but had a pattern with excellent surface profile.

Examples 9~20

Acid generators, basic additives and additives with low molecular additive (Add.-II) were dissolved in 550 parts by weight of propylene glycol methyl ether acetate and were added to the resins P2, P4 and P8 obtained from Polymerization examples 1–8, filtered by 0.2 $\mu$m membrane filter to produce the resist composition as shown in the following table 2.

With the only exception of using ArF excimer laser light exposure device (lens numerical aperture: 0.60), each of the above compositions, so produced in these Examples, then proceeded in accordance with the Example 1 to form a positive resist pattern and were placed under a variety of assays and the results are shown in the following table 2.

The evaluation for a dry etch resistance was performed by means of IEM type etching device(Tokyo Electron) under 30 mtorr of pressure and Ar(400 sccm), C$_4$F$_8$ (11 sccm), O$_2$(8 sccm) of flow rate for 120 seconds, and the relative values of the results compared to the etching speed of Novolak-based I-line are indicated.

Comparative Examples 4~6

The resist compositions were produced in the same as in the above Examples 9, 12 and 15 with the exception that low molecular additive (Add.-II) was not added.

With the only exception of using ArF excimer laser light exposure device (lens numerical aperture: 0.60), each of the above compositions, so produced in these Examples, then proceeded in accordance with the Example 1 to form a positive resist pattern and were placed under a variety of assays and the results are shown in the following table 2.

TABLE 2

|  | Resin (wt. part) | PAG (wt. part) | Base (wt. part) | Add. (wt. Part) | Sensitivity (mJ/cm$^2$) | Resolution ($\mu$m) | Dry etching rate |
|---|---|---|---|---|---|---|---|
| Example 9 | P2 (100) | 1.4 | 0.2 | Add.-I (25) | 20 | 0.13 | 1.24 |
| Example 10 | P2 (100) | 1.4 | 0.2 | Add.-II (25) | 22 | 0.13 | 1.20 |
| Example 11 | P2 (100) | 1.4 | 0.2 | Add.-V (25) | 19 | 0.14 | 1.23 |
| Example 12 | P4 (100) | 1.6 | 0.3 | Add.-I (25) | 17 | 0.12 | 1.28 |
| Example 13 | P4 (100) | 1.6 | 0.3 | Add.-II (25) | 18 | 0.13 | 1.24 |
| Example 14 | P4 (100) | 1.6 | 0.3 | Add.-V (25) | 20 | 0.13 | 1.25 |
| Example 15 | P7 (100) | 1.4 | 0.2 | Add.-I (25) | 16 | 0.13 | 1.28 |
| Example 16 | P7 (100) | 1.4 | 0.2 | Add.-II (25) | 18 | 0.13 | 1.23 |
| Example 17 | P7 (100) | 1.4 | 0.2 | Add.-III (25) | 17 | 0.13 | 1.25 |
| Example 18 | P7 (100) | 1.4 | 0.2 | Add.-IV (25) | 15 | 0.13 | 1.29 |
| Example 19 | P7 (100) | 1.4 | 0.2 | Add.-V (25) | 18 | 0.14 | 1.27 |
| Example 20 | P7 (100) | 1.4 | 0.2 | Add.-VI (25) | 17 | 0.13 | 1.29 |
| Com. 4 | P2 (100) | 1.4 | 0.2 | 0 | 25 | 0.14 | 1.32 |
| Com. 5 | P4 (100) | 1.6 | 0.3 | 0 | 23 | 0.14 | 1.36 |
| Com. 6 | P7 (100) | 1.4 | 0.2 | 0 | 23 | 0.14 | 1.35 |
| KrF excimer laser resist (PVP-based resin) |  |  |  |  |  |  | 1.34 |

TABLE 2-continued

| | Resin (wt. part) | PAG (wt. part) | Base (wt. part) | Add. (wt. Part) | Sensitivity (mJ/cm$^2$) | Resolution ($\mu$m) | Dry etching rate |
|---|---|---|---|---|---|---|---|
| I-line photoresist (Novolak resin) | | | | | | | 1.00 |
| Acid generator (PAG): Triphenylsulfonium nonaflate | | | | | | | |

The chemically amplified resist polymer of the present invention provides easy control of sensitivity by adjusting the kinds and contents of norbornene derivatives which is a repeating units of a backbone containing carboxylic acid and the resulting resist composition containing the norbornene derivatives have superiorities in substrate adhesion, dry etch resistance, the degree of transparency and resolution against radiation and thus are expected to be suitable in the manufacture of semi-conductor devices, especially suitable in KrF and ArF excimer laser and will be in the field of micro-processing under 0.20 micron in size.

What is claimed is:

1. A chemically amplified positive photoresist composition comprising a multi copolymer copolymer represented by the following formula I wherein polystyrene-calibrated weight average molecular weight (Mw) is 3,000~50,000 and molecular weight distribution(Mw/Mn) is 1.0~3.0, a low molecular additive represented by the following formula 2 or 3, an acid generator and a solvent:

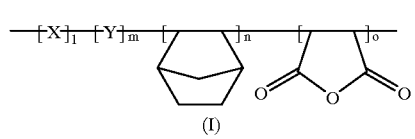

Formula 1

(I)

wherein the repeating units comprising X and Y are independent monomers, respectively, selected from the group consisting of the following formulae (II), (III) and (IV);

(II)

(III)

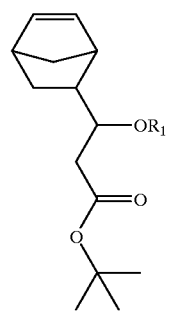

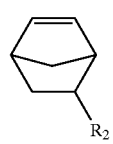

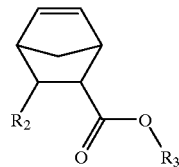

(IV)

wherein R$_1$ is a hydrogen atom, a linear or branched alkyl group, a cyclic or polycyclic alkyl group, an alkyl carbonyl group, a branched alkyl carbonyl group, a cyclic or polycyclic alkyl carbonyl group of 1 to 20 carbon atoms such as an acetyl group, a t-butyl oxy-carbonyl group, a cyclohexane carbonyl group, an adamantane carbonyl group a bicyclo[2,2,1]heptane methyl carbonyl group;

R$_2$ is a hydrogen atom, a hydroxyl group, carboxylic group, an alkyl group, an alkyl group containing an alkoxy group, a hydroxyl group or a carboxylic acid, an alkoxy group, a linear alkyl oxycarbonyl group, a branched alkyl oxycarbonyl group, an alkoxy alkyl carbonyl group, a cyclic alkyl oxycarbonyl group or polycyclic alkyl oxycarbonyl group of 1 to 20 carbon atoms;

R$_3$ is a hydrogen atom, a linear or branched alkyl group, a cyclic or polycyclic alkyl group of 1 to 20 carbon atoms such as a methyl group, an ethyl group, a t-butyl group, an isopropyl group, an adamantyl group, a bicyclo[2,2,1]heptane methyl group;

l, m, n and o, which respresents the repeating units of a polymer, are $0 \leq l/(1+m+n+o) \leq 0.5$, $0 \leq m/(1+m+n+o) \leq 0.5$, $0 \leq n/(1+m+n+o) \leq 0.35$ and $0.4 \leq o/(1+m+n+o) \leq 0.6$, repectively, with a value of $0.15 \leq (1+m)/(1+m+n+o) \leq 0.5$;

Formula 2

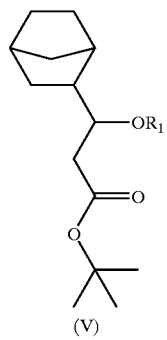

(V)

wherein $R_1$ is the same as defined above;

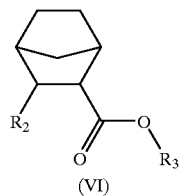

Formula 3

(VI)

wherein $R_2$ and $R_3$ are the same as defined above.

2. The chemically amplified positive photoresist composition according to claim 1, comprising 100 weight parts of a multi copolymer copolymer represented by the formula 1, 5~50 weight parts of a low molecular additive represented by the formula 2 or 3, 0.3~10 weight parts of the acid generator and a solvent.

3. The chemically amplified positive photoresist composition according to claim 1, wherein an amount of a basic additive is contained in less than 50 weight parts on the basis of 100 weight parts of an acid generator.

4. The chemically amplified positive photoresist composition according to claim 2, wherein an amount of a basic additive is contained in less than 50 weight parts on the basis of 100 weight parts of an acid generator.

* * * * *